United States Patent
Thomas et al.

(10) Patent No.: US 9,850,145 B2
(45) Date of Patent: Dec. 26, 2017

(54) WATER PURIFIER WITH INTEGRATED POWER GENERATOR

(71) Applicants: Peter McLean Thomas, Raleigh, NC (US); Rama Venkatasubramanian, Cary, NC (US); Sam Parry, Gilbert, AZ (US); Nancy Jochens, Kansas City, MO (US); Jerry Morrow, Leawood, KS (US)

(72) Inventors: Peter McLean Thomas, Raleigh, NC (US); Rama Venkatasubramanian, Cary, NC (US); Sam Parry, Gilbert, AZ (US); Nancy Jochens, Kansas City, MO (US); Jerry Morrow, Leawood, KS (US)

( * ) Notice: Subject to any disclaimer, the term of this patent is extended or adjusted under 35 U.S.C. 154(b) by 324 days.

(21) Appl. No.: 14/458,909

(22) Filed: Aug. 13, 2014

(65) Prior Publication Data
US 2015/0048028 A1    Feb. 19, 2015

Related U.S. Application Data

(60) Provisional application No. 61/865,260, filed on Aug. 13, 2013.

(51) Int. Cl.
*C02F 1/44*      (2006.01)
*B01D 61/00*    (2006.01)
(Continued)

(52) U.S. Cl.
CPC ............ *C02F 1/447* (2013.01); *B01D 61/00* (2013.01); *B01D 65/08* (2013.01); *H01L 35/00* (2013.01); *B01D 2313/34* (2013.01); *B01D 2313/365* (2013.01); *B01D 2313/38* (2013.01); *B01D 2321/22* (2013.01); *C02F 2303/10* (2013.01); *C02F 2303/20* (2013.01); *Y02W 10/30* (2015.05); *Y02W 10/37* (2015.05)

(58) Field of Classification Search
None
See application file for complete search history.

(56) References Cited

U.S. PATENT DOCUMENTS

| | | | |
|---|---|---|---|
| 4,316,774 A * | 2/1982 | Trusch | B01D 1/00 159/DIG. 27 |
| 2012/0114883 A1* | 5/2012 | Kapur | B32B 38/04 428/34.1 |
| 2014/0102965 A1* | 4/2014 | Jones | C02F 1/002 210/136 |

OTHER PUBLICATIONS

Liang et al, "Analysis of mass minimization of thermoelectric integrated membrane evaporation subsystem in wastewater . . . ", Space Medicine and Medical Engineering, vol. 14, No. 1, 2001.*

(Continued)

*Primary Examiner* — Krishnan S Menon
(74) *Attorney, Agent, or Firm* — Dunlap Bennett & Ludwig PLLC

(57) ABSTRACT

A water filtration system with power generating capability includes a membrane that receives relatively hot water on a dirty side, purifies the hot water, and transmits it to a clean side having relatively cold purified water. The system further includes at least one thermoelectric element coupled to the membrane that absorbs thermal energy from the dirty side and emits thermal energy into the clean side to generate electrical power. The system further includes at least one conductor electrically coupled to the at least one thermoelectric element that channels generated electrical power away from the at least one thermoelectric element.

20 Claims, 4 Drawing Sheets

(51) Int. Cl.
*B01D 65/08* (2006.01)
*H01L 35/00* (2006.01)

(56) References Cited

OTHER PUBLICATIONS

Wang et al Theoretical investigation on thermoelectric integrated membrane evaporation subsystem system, Abstract only, 1999; Experimental study of thermoelectric integrated direct distillation water purification systems: abstract: 2008.*

* cited by examiner

WATER PURIFIER WITH INTEGRATED POWER GENERATOR

TECHNICAL FIELD

The apparatus described herein relates to the field of water purification, more particularly, to the field of membrane water purification.

BACKGROUND

Energy and water are mutually dependent resources that are critical for the development and economic security of the United States as well as in many military operations. Specifically, energy production requires large volumes of water and conversely, water treatment, and distribution requires large amounts of energy. The interdependency between water and energy is often referred to as the water/energy nexus. For example, in generating nearly 90% of the electricity in the U.S., thermal power plants are only 30-40% energy-efficient and lose roughly 90% of the unused steam energy produced as waste heat via cooling towers. This lost energy, known as waste heat, is confined to not only thermal power plants, but virtually all production plants. Most (~60%) unrecovered industrial waste heat is considered low grade (i.e., T<200° C.). This means that it is uneconomical to recover the energy using current state-of-the-art heat recovery technologies, so it is lost to the environment.

Many water purification systems use RO membrane technology. RO membrane technology can remove a wide variety of contaminants and significantly reduce dissolved solids (i.e., salts) in a single treatment step. However they require regular maintenance that consume energy.

A water treatment process with the potential to be either self-sustaining or even a net energy producer would be a game-changing technology, with potential applications across virtually all industries. There is a need in the art for a way to purify water while being energy neutral or providing a net energy surplus.

BRIEF SUMMARY

A water filtration system with power generating capability includes a membrane that receives relatively hot water on a dirty side, purifies the hot water, and transmits it to a clean side having relatively cold purified water. The system further includes at least one thermoelectric element coupled to the membrane that absorbs thermal energy from the dirty side and emits thermal energy into the clean side to generate electrical power. The system further includes at least one conductor electrically coupled to the at least one thermoelectric element that channels generated electrical power away from the at least one thermoelectric element.

In some embodiments, the membrane uses a temperature gradient between the dirty side and the clean side to purify the water. In some embodiments, heat in the water on the dirty side is generated by waste heat. In some embodiments, heat in the water on the dirty side is generated by solar heat. In some embodiments, heat in the water on the dirty side is generated by a combination of waste heat and solar heat. In some embodiments, the electrical power generated by the at least one thermoelectric element is used to power at least one balance-of-plant component. In some embodiments, the at least one balance-of-plant component is one or a combination of: a pump, emergency power, a display, a quality control monitor, and a communication device. In some embodiments, the electrical power generated by the at least one thermoelectric element is used to power an anti-fouling system. In some embodiments, the anti-fouling system generates electrical pulses to prevent bio-fouling of the membrane. In some embodiments, the electrical pulses are produced by DC-DC conversion of low-voltage electrical power from the at least one thermoelectric element. In some embodiments, the at least one thermoelectric element comprises nanostructured materials made from at least one of the following: Bi2Te3, Sb2Te3, PbTe, PbSe, half-Heusler, and Si, SiGe. In some embodiments, the at least one thermoelectric element comprises both p-type and n-type elements. In some embodiments, the system further includes a heat exchanger that maintains a temperature gradient between the dirty side and the clean side.

A method of simultaneously purifying water and generating electricity includes providing a membrane that uses a temperature gradient to purify water. The method further includes providing at least one thermoelectric element to the membrane. The method further includes generating a temperature gradient across the membrane where a dirty side is hotter than a clean side. The method further includes transmitting water through the membrane from the dirty side to the clean side while leaving impurities on the dirty side. The method further includes absorbing heat on the dirty side and rejecting heat on the clean side with the at least one thermoelectric element to generate electrical power. The method further includes transmitting the electrical power from the membrane.

In some embodiments, the method further includes providing waste heat to dirty water being sent to the membrane. In some embodiments, the method further includes providing solar heat to dirty water being sent to the membrane. In some embodiments, the method further includes using a heat exchanger to transmit heat from the clean side to the dirty side. In some embodiments, the method further includes transmitting the electrical power back to the at least one thermoelectric element and cleaning the membrane by generating electrical pulses using the at least one thermoelectric element. In some embodiments, the method further includes transmitting the electrical power to a balance-of-plant component. In some embodiments, the balance-of-plant component is one of: a pump, emergency power, a display, a quality control monitor, and a communication device.

DETAILED DESCRIPTION

The subject system takes advantage of the abundant amount of low-grade waste heat to utilize membrane distillation to produce high-purity water for reuse and thermoelectric devices to produce electricity. The electricity generated by the thermoelectric devices (which convert low-grade waste heat to electricity) is used to provide anti-fouling capabilities.

Figure 1A:
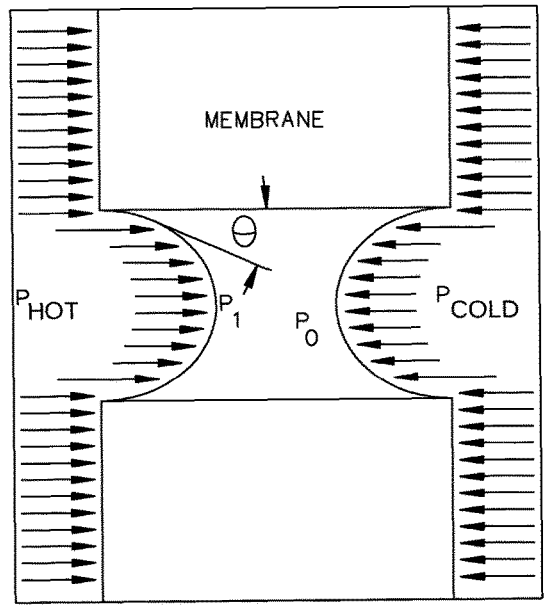
FIG. 1A is a schematic of capillary depression of water on a hydrophobic membrane.
Figure 1B:
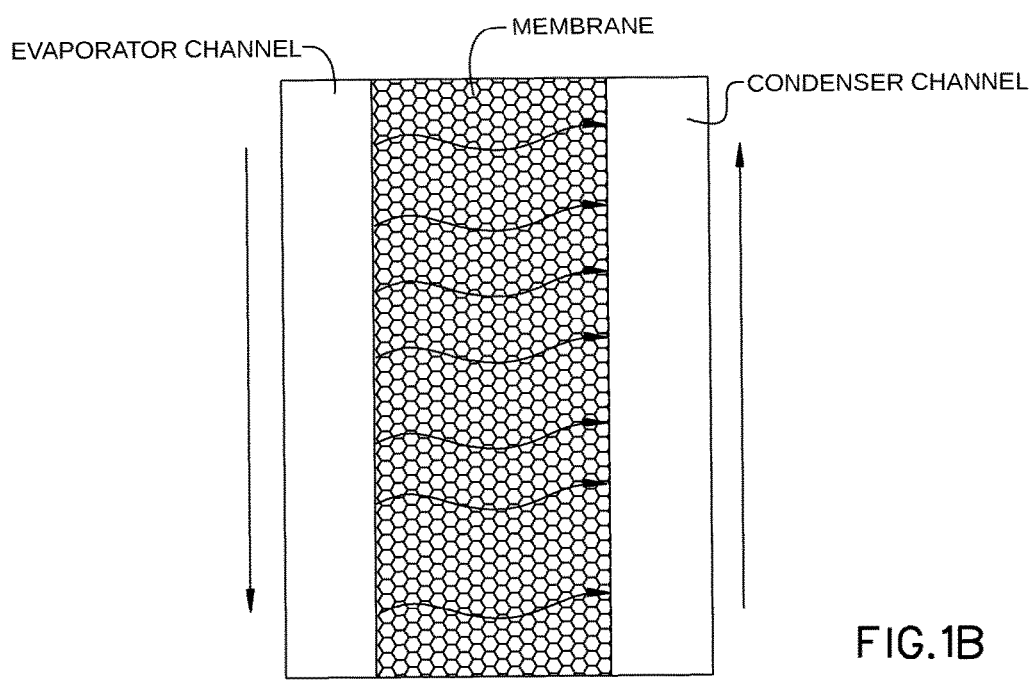
FIG. 1B is a schematic of a membrane distillation process.
Figure 1C:
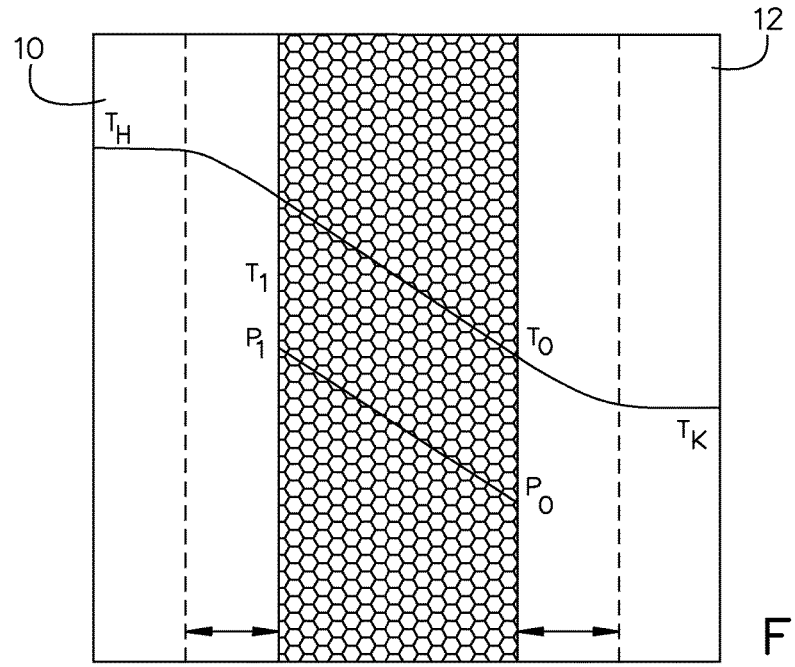
FIG. 1C is a schematic of temperature and pressure profiles through a membrane considering temperature polarization.

The system takes advantage of the common link between the membrane distillation (MD) process and a thermoelectric power device, namely: a heat source, a heat sink, and the necessity of a low thermally conductive material between them. In MD, this configuration is used to facilitate vapor transport to produce clean water. In thermoelectric devices, this configuration is used to convert heat into electricity. Both are candidate energy recovery technologies for low quality waste heat utilization. These principles are illustrated in FIGS. 1A-C.

The integration of thermoelectric heat-to-electric conversion devices with water-filtration technology, for water purification and simultaneous power towards generating water-plus-electricity from waste heat-and-wastewater, allows wastewater-plus-waste heat systems to be self-contained and not dependent on external electric utilities, thereby allowing the insertion of such systems in a wide variety of uses. Also, it can produce clean water, concentrated brines for mineral separation and other clean water and power producing applications.

Figure 2:
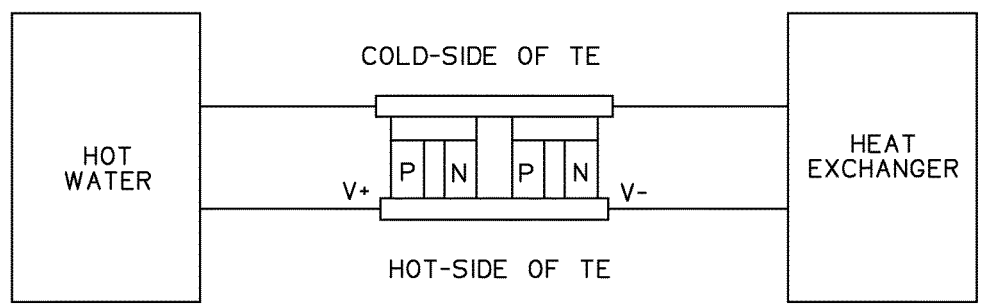
FIG. 2 is a schematic of one embodiment of the system.

FIG. 2 is a schematic of a thermoelectric converter integrated with membrane-distillation for simultaneous treatment and power generation.

Figure 3:
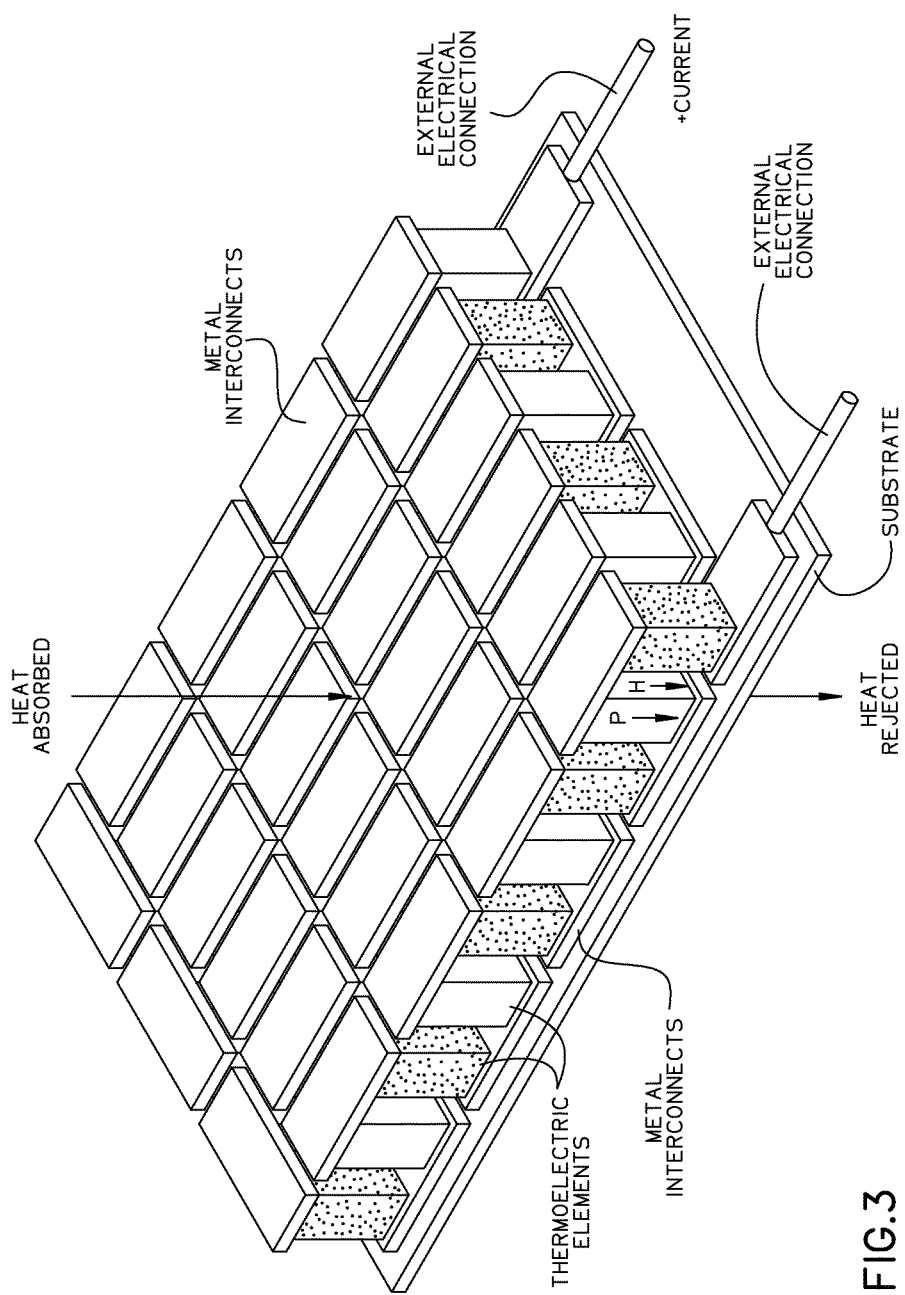
FIG. 3 is an isometric schematic of the embodiment of FIG. 2 showing the heat flow and electric power generated.

FIG. 3 is a schematic of the thermoelectric device, showing both heat flow and the resulting electric power that is generated. In some embodiments, heat is provided in the above configuration with warm water that is heated with solar heat or is naturally hot.

Figure 4:
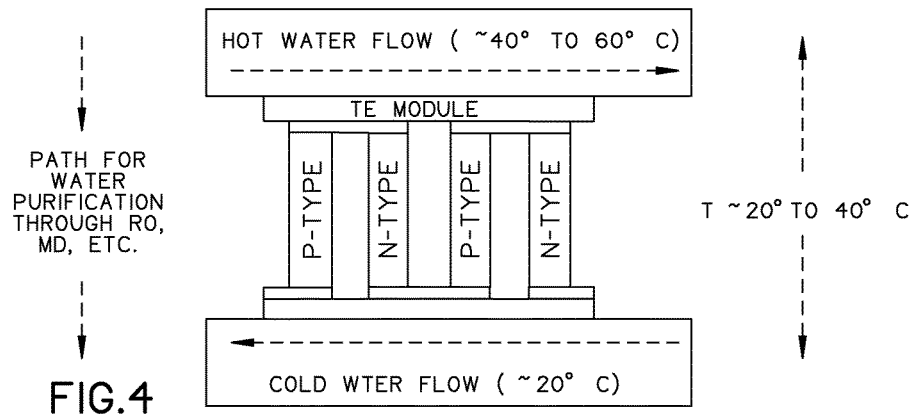
FIG. 4 is a schematic of the embodiment of FIG. 2.

FIG. 4 is an illustration of combined thermoelectric enabled membrane distillation for simultaneous water treatment and electricity production. Distillation membranes can be used to separate dirty, hot water from clean, cold water, with about temperature gradient (or deltaT) of 20 to 40° C. Embedding of a thermoelectric device into the membrane exploits the deltaT to generate power. In some embodiments, thermoelectric modules available from Micropelt and RTI or Marlow or Ferrotec are used by NET for in the system, and are similar to those illustrated in FIGS. 5A-C.

Thermoelectric (TE) devices are solid-state heat engines that convert heat flow into electricity. There are no moving parts, and can be fabricated to scale over many size scales. They operate via the principle of Seebeck effect (FIG. 3). The best thermoelectric materials share an important property with distillation membranes: that is, low thermal conductivity, to achieve a high DT for a given amount of heat; a higher DT directly translates to a higher Carnot efficiency.

FIG. 4 shows a conceptual illustration of a membrane that combines a TE device with an membrane distillation. As warmer water flows along one side of the membrane, the vapor pressure difference across the membrane facilitates transport of water vapor through the porous membrane matrix. At the same time this is happening, the temperature difference across the membrane drives the thermoelectric module, resulting in electricity generation. Water generation has always been a net energy consumer, with research efforts to date focused on minimizing the energy cost associate with water treatment. This approach, in which the waste-heat laden water facilitates simultaneous treatment and energy production, represents a step-change in the water-energy nexus.

Figure 5A:
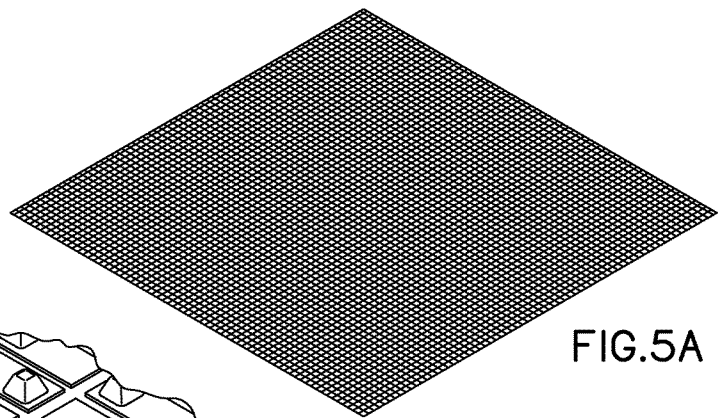
FIG. 5A is an isometric view of a sheet of thermoelectric modules in accordance with the embodiment shown in FIG. 2.
Figure 5B:
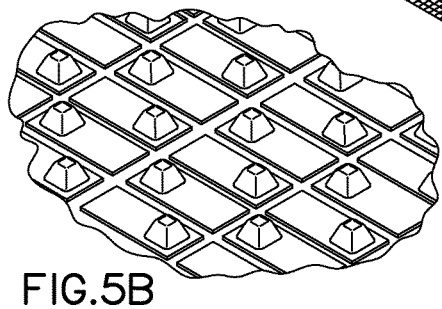
FIG. 5B is an isometric close-up view of the sheet of thermoelectric modules in accordance with the embodiment shown in FIG. 2.
Figure 5C:
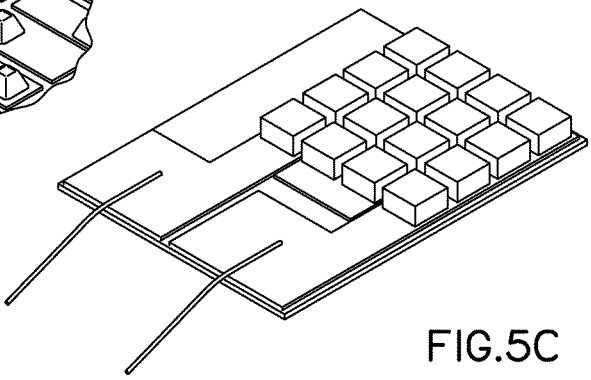
FIG. 5C is an isometric close-up view of a thermoelectric module in accordance with the embodiment shown in FIG. 2.

Thermoelectric devices are ideally suited to take advantage of the ability to produce power in such scenarios. A power value of about 100 mW can be obtained for deltaT=35K, corresponding to >200 mW/cm2; this power density is about 20-times that of a typical flat-plate PV array. Hence, with a very low packing fraction of <10% in terms of area by TE, it is sufficient to produce an effective 10 mW/cm2 as seen in a typical flat-plate PV array. This means >90% of the area is still available for MD to enable water purification. In some embodiments, the modules are similar to those manufactured by RTI, Nextreme/Laird Technologies, Marlow Industries, Ferrotec, Custom Thermoelectric and others. Examples of these types of sheets and modules are shown in FIGS. 5A-C.

The system is constructed using a polymer membrane. However, a ceramic membranes can be used with additional pre-treatment for hydrophobicity. In some embodiments, epoxies are used to coat the edges of the TE modules on both the hot side and cold side of the membrane. The chosen epoxy should be able to create a watertight seal at the TE-membrane interface, as well as be compatible with the membrane material. The epoxy seal should not only prevent unpurified water from leaking through to the cold side, but also protect the TE modules from the water flow.

Our RO approach will give us a water flux of 15 L/(m2-hr). The energy requirement for pumping water in an MD system is around 0.25 kWh/m3 of water produced. If the system is getting power from our TE-MD membrane at 10 mW/cm2=0.1 kW/m2, then the system will have 6.67 kWh for every m3 of water produced, which is more than enough to offset the 0.25 kWh/m3 required. Many water purification facilities would certainly be interested in a system that would have effectively zero operating cost. The large-scale, low-cost manufacturing of thermoelectric-plus-membrane distillation technology is a significantly valuable in enabling the manufacturing and production of high-value energy-water technologies.

The systems described herein can be integrated into water treatment plants. Design of a membrane distillation plant will involve the evaluation of existing MD technologies or the modification of existing MD technologies that best fit the team's proposed concept. The thermoelectric device is used in some embodiments to generate electric power to operate various so-called balance of plant components like pump, emergency power, display, quality control monitoring, communication devices, or power to enable anti-fouling procedures such as electric pulses to prevent bio-fouling. The design will include detailed engineering estimate of the energy efficiency, maintenance requirements, and physical footprint at design scales. A person would use the TE-MD membrane in conjunction with a single-step treatment system (such as RO or distillation) and produce power to be fed back into the system. Gray water from municipal sources will typically have BOD5 of from 200 to 300 mg/l, SS of 200 to 350 mg/l and fecal coliform/100 ml.

Additionally, chemical analysis of the bio-waste collected using this concept could be undertaken to predict waste volume, ease of removal, volatility of the waste and a possible means of disposal. We anticipate a physical footprint of less than 1 cubic meter per 1 kgal/day of product water. This technology can also be used in geothermal power plants and heat sources as well as conventional power plants. Also, it can create: clean water, concentrated brines for mineral separation and other clean water and power producing applications.

Although the invention has been described with reference to embodiments herein, those embodiments do not limit the invention. Modifications to those embodiments or other embodiments may fall within the scope of the invention.

What is claimed is:

1. A water filtration system with power generating capability, comprising:
   a membrane that receives relatively hot water on a dirty side, purifies the hot water, and transmits it to a clean side having relatively cold purified water;
   at least one thermoelectric element coupled to said membrane that absorbs thermal energy from the dirty side and emits thermal energy into the clean side to generate electrical power; and
   at least one conductor electrically coupled to said at least one thermoelectric element that channels generated electrical power away from said at least one thermoelectric element.

2. The system of claim 1, wherein said membrane uses a temperature gradient between the dirty side and the clean side to purify the water.

3. The system of claim 1, wherein heat in the water on the dirty side is generated by waste heat.

4. The system of claim 1, wherein heat in the water on the dirty side is generated by solar heat.

5. The system of claim 1, wherein heat in the water on the dirty side is generated by a combination of waste heat and solar heat.

6. The system of claim 1, wherein the electrical power generated by said at least one thermoelectric element is used to power at least one balance-of-plant component.

7. The system of claim 6, wherein the at least one balance-of-plant component is one or a combination of: a pump, emergency power, a display, a quality control monitor, and a communication device.

8. The system of claim 1, wherein the electrical power generated by said at least one thermoelectric element is used to power an anti-fouling system.

9. The system of claim 8, wherein the anti-fouling system generates electrical pulses to prevent bio-fouling of the membrane.

10. The system of claim 9, wherein the electrical pulses are produced by DC-DC conversion of low-voltage electrical power from the at least one thermoelectric element.

11. The system of claim 1, wherein said at least one thermoelectric element comprises nanostructured materials made from at least one of the following: Bi2Te3, Sb2Te3, PbTe, PbSe, half-Heusler, and Si, SiGe.

12. The system of claim 1, wherein said at least one thermoelectric element comprises both p-type and n-type elements.

13. The system of claim 1, further comprising:
   a heat exchanger that maintains a temperature gradient between the dirty side and the clean side.

14. A method of simultaneously purifying water and generating electricity, comprising:
   (a) providing a membrane that uses a temperature gradient to purify water;
   (b) providing at least one thermoelectric element to the membrane;
   (c) generating a temperature gradient across the membrane where a dirty side is hotter than a clean side;
   (d) transmitting water through the membrane from the dirty side to the clean side while leaving impurities on the dirty side;
   (e) absorbing heat on the dirty side and rejecting heat on the clean side with the at least one thermoelectric element to generate electrical power; and
   (f) transmitting the electrical power from the membrane.

15. The method of claim 14, wherein step (c) includes providing waste heat to dirty water being sent to the membrane.

16. The method of claim 14, wherein step (c) includes providing solar heat to dirty water being sent to the membrane.

17. The method of claim 14, wherein step (c) includes using a heat exchanger to transmit heat from the clean side to the dirty side.

18. The method of claim 14, further comprising:
   (g) transmitting the electrical power back to the at least one thermoelectric element;
   (h) cleaning the membrane by generating electrical pulses using the at least one thermoelectric element.

19. The method of claim 14, further comprising:
   (g) transmitting the electrical power to a balance-of-plant component.

20. The method of claim 19, wherein the balance-of-plant component is one of: a pump, emergency power, a display, a quality control monitor, and a communication device.

* * * * *